(12) United States Patent
Kunii et al.

(10) Patent No.: US 6,734,635 B2
(45) Date of Patent: May 11, 2004

(54) PROCESS OF CRYSTALLIZING SEMICONDUCTOR THIN FILM AND LASER IRRADIATION SYSTEM

(75) Inventors: Masafumi Kunii, Kanagawa (JP); Makoto Takatoku, Kanagawa (JP); Michio Mano, Kanagawa (JP)

(73) Assignee: Sony Corporation (JP)

( * ) Notice: Subject to any disclaimer, the term of this patent is extended or adjusted under 35 U.S.C. 154(b) by 378 days.

(21) Appl. No.: 09/968,843

(22) Filed: Oct. 3, 2001

(65) Prior Publication Data

US 2002/0047580 A1 Apr. 25, 2002

Related U.S. Application Data

(62) Division of application No. 09/550,293, filed on Apr. 14, 2000, now Pat. No. 6,388,386.

(30) Foreign Application Priority Data

Apr. 19, 1999 (JP) ......................................... P11-110237

(51) Int. Cl.[7] ................................................ B05D 3/06
(52) U.S. Cl. .......................... 315/169.3; 345/94; 427/8; 438/487
(58) Field of Search ........................... 315/169.1, 169.3, 315/111.21; 345/90–100; 427/8, 554, 555; 438/486, 487

(56) References Cited

U.S. PATENT DOCUMENTS 5,372,836 A * 12/1994 Imahashi et al. ............... 427/8
5,624,851 A * 4/1997 Takayama et al. .......... 438/166
5,680,147 A * 10/1997 Yamazaki et al. ............ 345/94
6,143,366 A * 11/2000 Lu ............................ 427/376.3

FOREIGN PATENT DOCUMENTS

WO   WO 97/45827   * 12/1997   ............ G09G/3/36

* cited by examiner

Primary Examiner—Don Wong
Assistant Examiner—Jimmy Vu
(74) Attorney, Agent, or Firm—Rader, Fishman & Grauer PLLC; Ronald P. Kananen

(57) ABSTRACT

A process of crystallizing a semiconductor thin film previously formed on a substrate by irradiating the semiconductor thin film with a laser beam, includes:

a preparation step of dividing the surface of the substrate into a plurality of division regions, and shaping a laser beam to adjust an irradiation region of the laser beam such that one of the division regions is collectively irradiated with one shot of the laser beam;

a crystallization step of irradiating one of the division regions with the laser beam while optically modulating the intensity of the laser beam such that a cyclic light-and-dark pattern is projected on the irradiation region, and irradiating the same division region by at least one time after shifting the pattern such that the light and dark portions of the pattern after shifting are not overlapped to those of the pattern before shifting; and a scanning step of shifting the irradiation region of the laser beam to the next division region, and repeating the crystallization step for the division region.

4 Claims, 10 Drawing Sheets

STRAIGHT LINE SLIT

CORRUGATED SLIT

CHEVRON

GRID SLIT

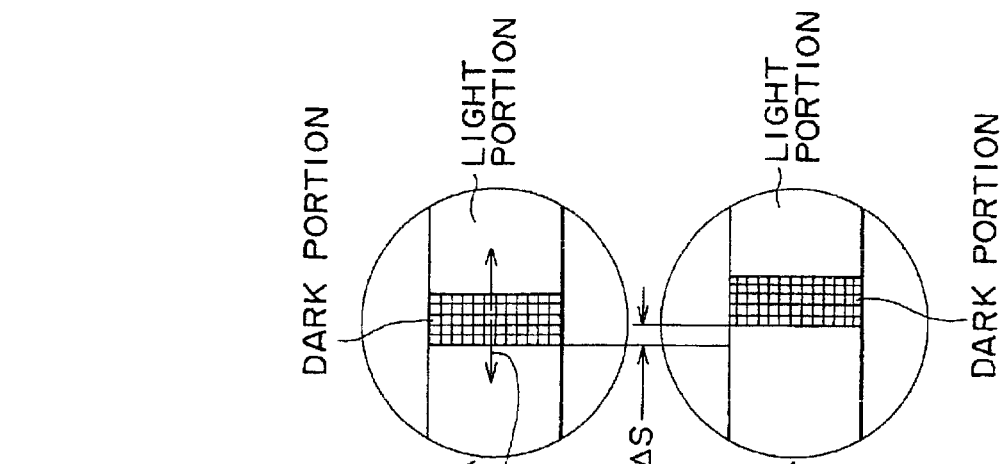
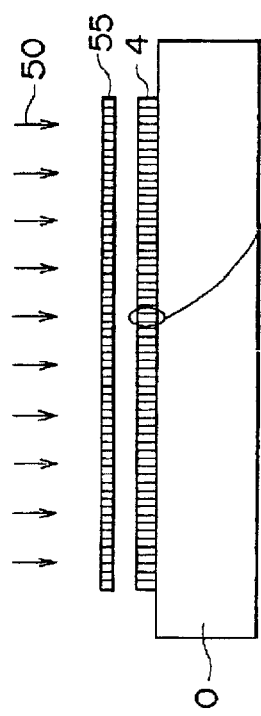
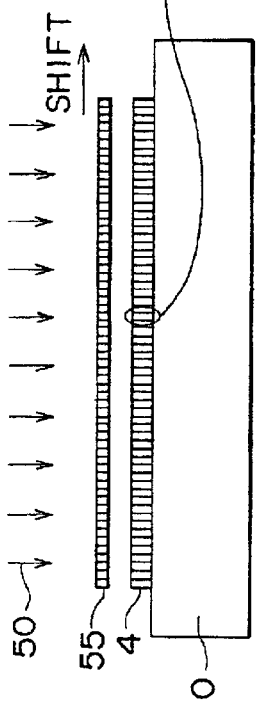
FIG.4A
FIG.4B

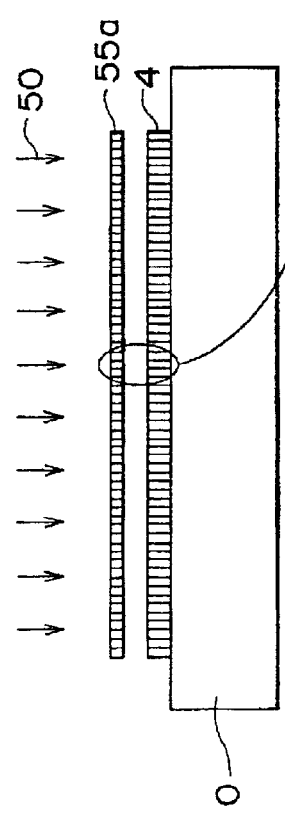
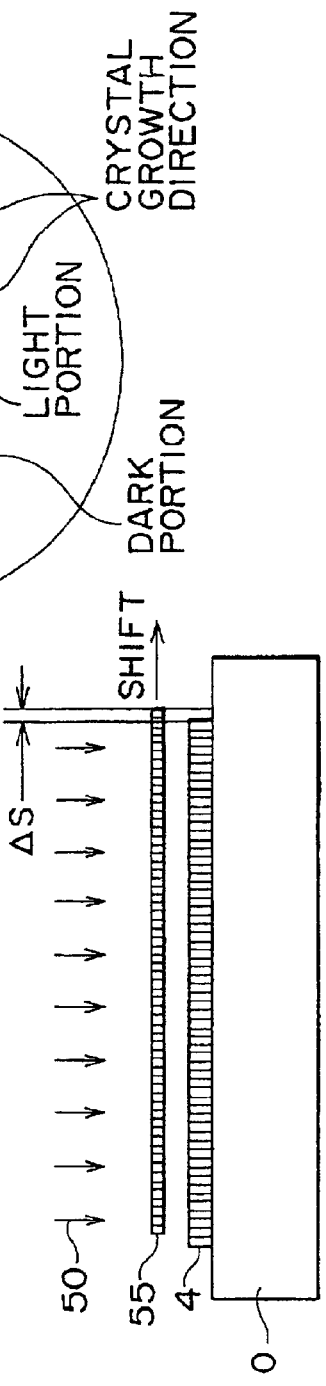
FIG. 9A
FIG. 9B

PROCESS OF CRYSTALLIZING SEMICONDUCTOR THIN FILM AND LASER IRRADIATION SYSTEM

This application is a divisional of application Ser. No. 09/550,293, filed Apr. 14, 2000 now U.S. Pat. No. 6,388,386.

BACKGROUND OF THE INVENTION

The present invention relates to a process of crystallizing a semiconductor thin film, a laser irradiation system used for carrying out the crystallization process, a thin film transistor fabricated by using the process and system, and a display using the thin film transistor.

Thin film transistors have been widely used as switching devices for liquid crystal displays and organic EL displays. In particular, a thin film transistor including an active layer made from poly-crystal silicon is advantageous in that not only switching devices and peripheral drive circuits can be provided on the same substrate. The poly-crystal silicon thin film transistor is also advantageous in that it can be made fine, to allow the opening ratio of the pixel structure to be increased. For these reasons, the poly-crystal silicon thin film transistor has received attention as a device for a high-definition display. In recent years, a technique of fabricating the poly-crystal silicon thin film transistor by using a low temperature process performed at 600° C. or less has been actively studied. The adoption of the so-called low temperature process eliminates the need of using an expensive heat-resisting substrate, and thereby contributes to cost reduction and enlargement of the display. In particular, it has been increasingly required to pack not only switching devices for pixels and peripheral drive circuits but also a highly functional device represented by a central processing unit (CPU) on the same substrate. To meet such a requirement, it is expected to develop a technique of forming a poly-crystal silicon thin film having a high quality similar to that of a single crystal silicon thin film.

In accordance with the related art low temperature process, an excimer laser beam or electron beam formed in a long-sized shape or linear shape is scanned to irradiate the surface of a substrate on which amorphous silicon is previously deposited, to convert the amorphous silicon into poly-crystal silicon. Alternatively, the substrate is collectively irradiated with an excimer laser beam formed into a rectangular shape having a large area, to convert amorphous silicon into poly-crystal silicon. The irradiation of the substrate with a high energy beam such as a laser beam or electron beam can rapidly heat and melt only amorphous silicon on the substrate without giving damages to the substrate. The crystallization of silicon occurs at the subsequent cooling step, to result in an aggregation of poly-crystals having a relatively large grain size. For the energy beam having been used, however, the pulse continuation time is as very short as 20–200 ns. As a result, since a time required for amorphous silicon to be re-solidified after being melted is very short, so that the melted silicon is actually rapidly cooled and converted into poly-crystal silicon. The occurrence frequency of crystal nuclei becomes higher by rapid cooling of the melted silicon. As a result, the grain size of the poly-crystal silicon thus obtained becomes smaller. The mobility of the thin film transistor using the poly-crystal silicon having a small grain size as an active layer is as small as about 80 $cm^2/Vs$ for the N-channel type MOS transistor. Accordingly, to pack a circuit having a high function, together with switching devices for pixels, on the same substrate, it is required to significantly improve the performance of thin film transistors. To meet such a requirement, there has been proposed a technique of irradiating a substrate with a laser beam in a state in which the substrate is heated at about 400° C. By previously heating the substrate, the re-crystallization rate (cooling rate) after laser irradiation becomes slow, to thereby increase the crystal grain size. According to this technique, however, in the case of using a glass substrate, the upper limit of the heating temperature becomes about 450° C. due to the thermal limitation of the glass substrate, which temperature is much lower than the melting point of silicon, that is, 1400° C. As a result, even by adopting the method of pre-heating the substrate, poly-crystal silicon is rapidly cooled after laser irradiation, so that it is difficult to obtain poly-crystal silicon having a large crystal grain size similar to that of single crystal silicon.

Another method of forming poly-crystal silicon having a large crystal grain size is disclosed, for example, in Japanese Patent Laid-open No. Hei 7-297125, in which a catalyst metal is introduced in a silicon thin film for allowing crystals of silicon to grow in a specific crystal orientation. The method, however, basically requires a solid-growth process characterized in that annealing is performed at a temperature of 550° C. or more, and therefore, the method is poor in matching with the low temperature process. Further, since a catalyst metal remains in the silicon thin film, it is required to provide the additional step of removing the metal component by gettering.

SUMMARY OF THE INVENTION

An object of the present invention is to provide a process of simply forming a silicon thin film having a crystallinity similar to that of single crystal silicon over a large area at a high throughput.

To achieve the above object, according to a first aspect of the present invention, there is provided a process of crystallizing a semiconductor thin film previously formed on a substrate by irradiating the semiconductor thin film with a laser beam, including:

a preparation step of dividing the surface of the substrate into a plurality of division regions, and shaping a laser beam to adjust an irradiation region of the laser beam such that one of the division regions is collectively irradiated with one shot of the laser beam;

a crystallization step of irradiating one of the division regions with the laser beam while optically modulating the intensity of the laser beam such that a cyclic light-and-dark pattern is projected on the irradiation region, and irradiating the same division region by at least one time after shifting the pattern such that the light and dark portions of the pattern after shifting are not overlapped to those of the pattern before shifting; and a scanning step of shifting the irradiation region of the laser beam to the next division region, and repeating the crystallization step for the division region.

The crystallization step preferably includes a step of controlling the direction of crystallization by making use of a temperature gradient corresponding to the light-and-dark pattern, and irradiating the same division region again after shifting the pattern by a distance within a crystallization distance by one shot of laser irradiation. Further, the crystallization step is preferably carried out in a state in which the substrate is heated at a temperature of 200° C. or more.

According to a second aspect of the present invention, there is provided a laser irradiation system for crystallizing a semiconductor thin film previously formed on a substrate by irradiating the semiconductor thin film with a laser beam, including:

shaping means for shaping, when the surface of the substrate is divided into a plurality of division regions, a laser beam to adjust an irradiation region of the laser beam such that one of the division regions is collectively irradiated with one shot of the laser beam;

optical means for optically modulating the intensity of the laser beam such that a cyclic light-and-dark pattern is projected on the irradiation region;

primary scanning means for irradiating one of the division regions with the optically modulated laser beam, and irradiating the same division region after shifting the pattern such that the light and dark portions of the pattern after shifting are not overlapped to those of the pattern before shifting; and secondary scanning means for shifting the irradiation region of the laser beam to the next division region, and repeating the crystallization step for the division region.

The optical means preferably includes a micro-slit on which a cyclic light-and-dark pattern is depicted, the optical means being inserted in the optical path of the laser beam; or a phase shift mask which diffracts the laser beam to form a cyclic light-and-dark pattern, the optical means being inserted in the optical path of the laser beam.

According to a third aspect of the present invention, there is provided a thin film transistor including:

a semiconductor thin film;

a gate insulating film stacked on one surface of the semiconductor thin film; and a gate electrode stacked on the semiconductor thin film via the gate insulating film;

the semiconductor thin film is obtained by forming amorphous silicon or poly-crystal silicon having a relatively small grain size on a substrate, and irradiating the amorphous silicon or poly-crystal silicon having a relatively small grain size with the laser beam to crystallize the amorphous silicon or poly-crystal silicon having a relatively small grain size into poly-crystal silicon having a relatively large grain size; and the crystallization of the semiconductor thin film is performed by dividing the surface of the substrate into a plurality of division regions, and shaping a laser beam to adjust an irradiation region of the laser beam such that one of the division regions is collectively irradiated with one shot of the laser beam; irradiating one of the division regions with the laser beam while optically modulating the intensity of the laser beam such that a cyclic light-and-dark pattern is projected on the irradiation region, and irradiating the same division region by at least one time after shifting the pattern such that the light and dark portions of the pattern after shifting are not overlapped to those of the pattern before shifting; and shifting the irradiation region of the laser beam to the next division region, and repeating the crystallization for the division region.

According to a fourth aspect of the present invention, there is provided a display including:

a pair of substrates jointed to each other with a specific gap put therebetween; and an electrooptic material held in the gap between the substrates;

a counter electrode formed on one of the substrates; and pixel electrodes and thin film transistors for driving the pixel electrodes, which are formed on the other of the substrates, each of the thin film transistor including a semiconductor thin film and a gate electrode stacked on one surface of the semiconductor thin film via a gate insulating film;

wherein the semiconductor thin film is obtained by forming amorphous silicon or poly-crystal silicon having a relatively small grain size on the other substrate, and irradiating the amorphous silicon or poly-crystal silicon having a relatively small grain size with the laser beam to crystallize the amorphous silicon or poly-crystal silicon having a relatively small grain size into poly-crystal silicon having a relatively large grain size; and the crystallization of the semiconductor thin film is performed by dividing the surface of the substrate into a plurality of division regions, and shaping a laser beam to adjust an irradiation region of the laser beam such that one of the division regions is collectively irradiated with one shot of the laser beam; irradiating one of the division regions with the laser beam while optically modulating the intensity of the laser beam such that a cyclic light-and-dark pattern is projected on the irradiation region, and irradiating the same division region by at least one time after shifting the pattern such that the light and dark portions of the pattern after shifting are not overlapped to those of the pattern before shifting; and shifting the irradiation region of the laser beam to the next division region, and repeating the crystallization for the division region.

According to a fifth aspect of the present invention, there is provided an organic EL display including:

pixel electrodes containing luminous portions made from an organic EL material and thin film transistors for driving the pixel electrodes, which are formed on a substrate, each of the thin film transistors including a semiconductor thin film and a gate electrode stacked on one surface of the semiconductor thin film via a gate insulating film;

wherein the semiconductor thin film is obtained by forming amorphous silicon or poly-crystal silicon having a relatively small grain size on the substrate, and irradiating the amorphous silicon or poly-crystal silicon having a relatively small grain size with the laser beam to crystallize the amorphous silicon or poly-crystal silicon having a relatively small grain size into poly-crystal silicon having a relatively large grain size; and the crystallization of the semiconductor thin film is performed by dividing the surface of the substrate into a plurality of division regions, and shaping a laser beam to adjust an irradiation region of the laser beam such that one of the division regions is collectively irradiated with one shot of the laser beam; irradiating one of the division regions with the laser beam while optically modulating the intensity of the laser beam such that a cyclic light-and-dark pattern is projected on the irradiation region, and irradiating the same division region by at least one time after shifting the pattern such that the light and dark portions of the pattern after shifting are not overlapped to those of the pattern before shifting; and shifting the irradiation region of the laser beam to the next division region, and repeating the crystallization for the division region.

According to the present invention, the surface of a substrate is divided into a matrix pattern, to define a plurality of rectangular division regions, and correspondingly a laser beam is shaped into a rectangular shape such that one of the division regions can be collectively irradiated with one shot of the laser beam. The intensity of the laser beam is optically modulated such that a cyclic light-and-dark pattern is projected on the irradiation region shaped into the rectangular shape, and one of the division regions is irradiated with one shot of the laser beam. The direction of the crystallization is controlled by making use of a temperature gradient corresponding to the light-and-dark pattern. Then, the same division region is irradiated again with one shot of the laser beam after the pattern is shifted such that the light and dark portions of the pattern after shifting are not overlapped to those of the pattern before shifting. In this case, by performing the crystallization after shifting the pattern by a distance within the crystallization distance by one shot of laser irradiation, it is possible to obtain more homogeneous crystals. The above crystallization step is repeated several times, and when the pattern is shifted by one cycle of the light or dark portions of the pattern, the irradiation region of the laser beam is shifted from the initial division region to the next division region, and the crystallization step is repeated for the division region. A large area semiconductor thin film can be thus effectively crystallized.

BRIEF DESCRIPTION OF THE DRAWINGS

FIGS. 4A and 4B are diagrams each showing a crystallization step for illustrating the crystallization process of the present invention;

FIGS. 9A and 9B are views each showing a crystallization step for illustrating another example of the crystallization process of the present invention;

DESCRIPTION OF THE PREFERRED EMBODIMENTS

Hereinafter, embodiments of the present invention will be described in detail with reference to the drawings.

Figure 1:
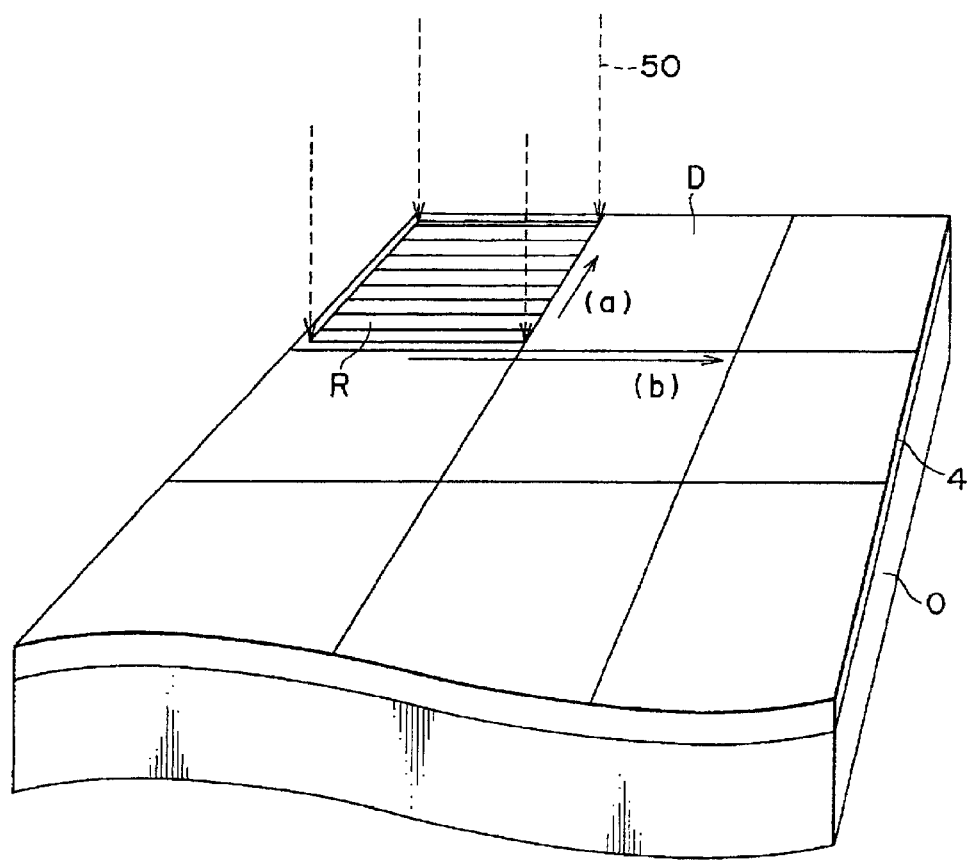
FIG. 1 is a perspective view showing a crystallization process of the present invention.

FIG. 1 is a schematic perspective view showing an embodiment of a crystallization process according to the present invention. According to the crystallization process of the present invention, a semiconductor thin film 4 previously formed on a substrate 0 made from typically glass is crystallized as follows: namely, the semiconductor thin film 4 is irradiated with a laser beam 50, so that a semiconductor such as silicon melted once by irradiation of the laser beam 50 is crystallized at the cooling step. To be more specific, at the preparation step, the surface of the substrate 0 is divided into a matrix pattern, to define a plurality of division regions D, and the laser beam 50 is shaped to adjust an irradiation region R of the laser beam 50 into a rectangular shape such that one of the rectangular division regions D is collectively irradiated with one shot of the laser beam 50. Accordingly, the shape of the irradiation region R is matched to that of the division region D. At the next crystallization step, the initial division region D positioned at the upper left side of the substrate 0 is irradiated with the laser beam 50. At this time, the intensity of the laser beam 50 is optically modulated such that a cyclic light-and-dark pattern is projected on the irradiation region R. Then, the same division irradiation region D is irradiated again with the laser beam 50 at least one time after the pattern is shifted in such a manner that the light and dark portions of the pattern after shifting are not overlapped to those of the pattern before shifting. The shift direction of the pattern is designated by an arrow "a". After that, the irradiation region R of the laser beam 50 is shifted to the next division region D positioned on the right side of the initial division region D, and the crystallization step is repeated for the division region D. The movement direction of the scanning step is designated by an arrow (b). At the crystallization step, the direction of crystallization is controlled by a temperature gradient corresponding to the light-and-dark pattern, and the pattern is shifted by a distance within the crystallization distance by one shot of laser irradiation and the same division region D is irradiated with the laser beam. After that, such a crystallization step is repeated. By carrying out the crystallization step in a state in which the substrate 0 is heated to a temperature of 200 □ or more, a more homogeneously crystalline state can be obtained.

According to the present invention, the surface of the substrate 0 is divided into a matrix pattern, to define a plurality of the rectangular division regions D, and the laser beam 50 is shaped into a rectangular shape such that one of the division regions D can be collectively irradiated with one shot of the laser beam 50. The intensity of the laser beam 50 is optically modulated such that a cyclic light-and-dark pattern is projected on the irradiation region R shaped into the rectangular shape, and one of the division regions D is irradiated with one shot of the laser beam 50. The direction of the crystallization is controlled by making use of a temperature gradient corresponding to the light-and-dark pattern. Then, the same division region D is irradiated again with one shot of the laser beam after the pattern is shifted such that the light and dark portions of the pattern after shifting are not overlapped to those of the pattern before shifting. In this case, by performing the crystallization after shifting the pattern by a distance within the crystallization distance by one shot of laser irradiation, it is possible to obtain more homogeneous crystals. The above step is repeated several times, and when the pattern is shifted by one cycle of the light or dark portions of the pattern, the irradiation region R of the laser beam 50 is shifted from the initial division region D to the next division region D, and the crystallization step is repeated for the division region D. A large area semiconductor thin film 4 can be thus effectively crystallized.

In the example shown in FIG. 1, by shifting the pattern in the direction (a) step by step (for example, by each distance of 1 μm) to crystallize the initial rectangular division region D, largely shifting the irradiation region R to the next division region D in the direction (b), and repeating the above step for the division region D, the entire surface of the semiconductor thin film 4 on the substrate 50 is crystallized. In this case, the rectangular division region D has a size of 61 mm×73 mm, and the entire area of the rectangular laser irradiation region R corresponding to the division region D is covered with the light-and-dark pattern. In the case where the width of each dark portion is 1 μm; a space between the adjacent dark portions is 5 μm; the position shift amount of the laser beam 50 is 0.75 μm; and the crystallization distance by one shot of laser irradiation (lateral crystal growth distance) is 1 μm, the entire area of the rectangular division region D is homogeneously crystallized by 5–7 shots of laser irradiation. In the case where the rectangular division region D has a size of 61 mm×73 mm and the glass substrate 0 has a size of 600 mm×720 mm, letting the overlapped width of the beams between the adjacent division regions be 1 mm, the total shot number required for crystallization of the entire semiconductor thin film on the substrate 0 becomes 500–700 shots when the frequency of laser oscillation is set at 10 Hz. As a result, the tack time for crystallization required for each substrate becomes about 50–70 seconds, which is sufficiently fast as the throughput for mass-production.

By heating the glass substrate at a temperature of 200° C. or more, preferably, in a range of 400° C. to 650° C. at the laser crystallization step, the cooling rate upon solidification of the melted silicon of the semiconductor thin film 4 is made low. This is effective to suppress the occurrence frequency of crystal nuclei, and hence to obtain a semiconductor thin film made from silicon crystals with less defect density. The substrate 0 may be heated by resistance heating, or lamp heating using an Xe arc lamp or halogen lamp.

Figure 2A:
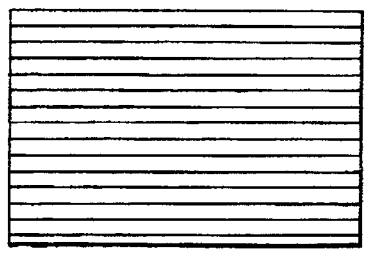
FIGS. 2A to 2D are schematic diagrams each showing an example of a cyclic light-and-dark pattern used for the crystallization process of the present invention.
Figure 2B:
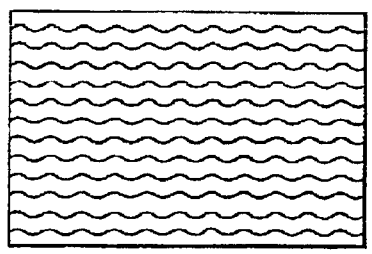
Figure 2C:
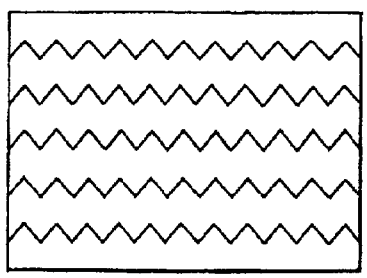
Figure 2D:
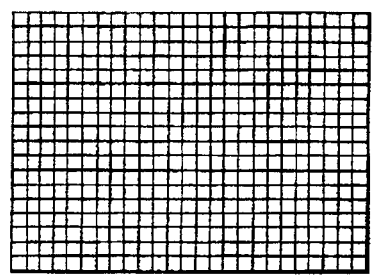

FIGS. 2A to 2D are schematic plan views each showing an example of a cyclic light-and-dark pattern which is composed of light and dark portions cyclically arranged. FIG. 2A shows a straight line light-and-dark pattern. The pattern used in the present invention is not limited thereto but may be a corrugated slit pattern shown in FIG. 2B, a chevron pattern shown in FIG. 2C, or a grid pattern shown in FIG. 2D. What is essential is that the substrate may be irradiated with a laser beam having a pattern of light and dark portions cyclically arranged in a one-dimensional or two-dimensional pattern.

Figure 3:
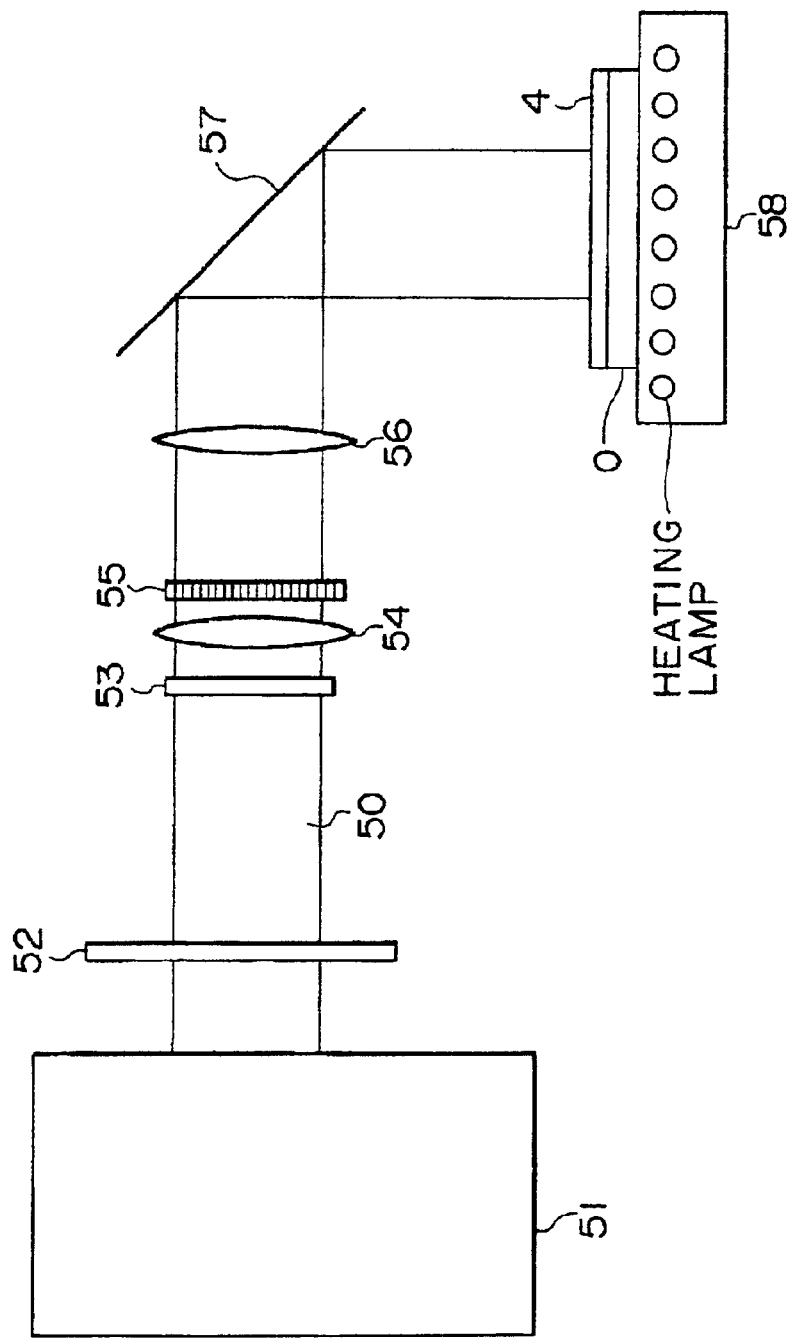
FIG. 3 is a block diagram showing a laser irradiation system of the present invention.

Hereinafter, one example of a laser system for collectively irradiating a large area with a laser beam according to the present invention will be described with reference to FIG. 3. Such a system is suitable for carrying out the crystallization process of the present invention. In FIG. 3, reference numeral 51 designates a large output excimer laser light source; 52 is a slit for shaping a laser beam into a rectangular shape; 53 is a beam homogenizer; 54 is a condenser lens; 55 is a micro-slit; 56 is an imaging lens; 57 is a mirror; and 58 is an XY-stage on which the substrate 0 is mounted. A lamp for heating the substrate is mounted in the XY-stage 58. The semiconductor thin film 4 made from Si is previously formed on the substrate 0. The laser irradiation system of the present invention, which is basically configured to crystallize the semiconductor thin film 4 previously formed on the substrate 0 by irradiating the semiconductor thin film 4 with the laser beam 50, includes shaping means, optical means, primary scanning means, and secondary scanning means. The shaping means includes the beam shaping slit 52 and the beam homogenizer 53. When the surface of the substrate 0 is divided into a plurality of division regions, the beam shaping means shapes the laser beam 50 to adjust the irradiation region of the laser beam 50 such that one division region is collectively irradiated with one shot of the laser beam 50. The optical means, which includes the condenser lens 54, the micro-slit 55, the imaging lens 56, and the mirror 57, is used to optically modulate the intensity of the laser beam 50 such that a cyclic light-and-dark pattern is projected on the irradiation region of the laser beam 50. The primary scanning means is composed of the XY-stage 58. After one division region on the surface of the substrate 0 mounted on the XY-stage 58 is irradiated with the optically modulated laser beam 50, the pattern is shifted by the primary scanning means such that the light and dark portions of the pattern after shifting are not overlapped to those of the pattern before shifting, and the same division region is irradiated with the laser beam 50. The secondary scanning means is also composed of the XY-stage 58. The irradiation region of the laser beam 50 is shifted to the next division region by the secondary scanning means, and the crystallization step is repeated for the division region. In this embodiment, the optical means includes the micro-slit 55 on which a cyclic light-and-dark pattern is depicted, and the micro-slit 55 is inserted in the optical path of the laser beam 50. It should be noted that the micro-slit 55 may be disposed directly over the substrate 0.

The micro-slit 55 is produced by forming stripes, each having a width of 1 to 2 μm, of a shade film, typically, made from a refractory metal having a good heat resistance such as Mo or W on a transparent base member such as a glass sheet in such a manner that the stripes are spaced from each other at intervals of about 1 to 15 μm. The width and interval of the slits are each set such that the corresponding width and interval of the light and dark portions of the pattern projected on the substrate 0 are nearly equal to or several times less than a lateral growth distance of the crystal from one shot of the laser irradiation. The laser beam 50 emitted from the XeCl excimer laser light source 51 has a wavelength of 308 nm, and has a pulse continuation time of one shot in a range of 100 to 200 ns. By focusing the pattern of the micro-slit 55 on the semiconductor thin film 4 made from amorphous silicon on the glass substrate 0 and irradiating the semiconductor thin film 4 with the pulse laser beam 50 under the above condition, silicon at the light portions irradiated with the laser beam 50 is melted while silicon at the dark portions taken as the shade portions is left as solid. In such a state, crystal growth proceeds in the lateral direction from the solid silicon to the melted silicon by a distance of about 0.3 to 1.5 μm on one side by one laser shot. Then, by shifting the micro-slit 55 relative to the substrate 0 by a distance shorter than the lateral crystal growth distance and repeating the laser shot in accordance with the same manner, the crystal continuously grows in the lateral direction.

FIGS. 4A and 4B are schematic diagrams each showing the state of crystal growth according to the process of the present invention. Referring to FIG. 4A, when the semiconductor thin film 4 is irradiated with the laser beam 50 via the micro-slit 55, only the light portions on the semiconductor thin film 4; which correspond to the non-masked portions of the micro-slit 55, are melted by laser irradiation, and simultaneously the crystal growth proceeds in the lateral direction from the dark portions or shade portions corresponding to the masked portions of the micro-slit 55. Then, as shown in FIG. 4B, when the micro-slit 55 is shifted in the crystal growth direction by a distance ΔS shorter than the lateral crystal growth distance, and the semiconductor thin film 4 is irradiated again with one shot laser, the entire surface of the rectangular laser irradiation region is crystallized. According to this crystallization process, it is possible to obtain a crystalline silicon thin film having a very high quality with no crystal grain boundary in the crystal growth direction.

Figure 5A:
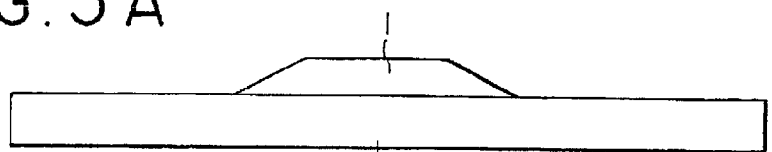
FIGS. 5A to 5D are views showing sequential fabrication steps for illustrating a first embodiment of a method of fabricating a thin film transistor according to the present invention.

FIGS. 5A to 5D show sequential fabrication steps illustrating a first embodiment of a method of fabricating a thin film transistor used for typically an LCD according to the present invention. The mobility of a poly-crystal silicon thin film transistor fabricated in accordance with this embodiment is in a range of 270 to 350 cm$^2$/VS for the N-channel type and is in a range of 160 to 250 cm$^2$/Vs for the P-channel type, which is significantly higher than that of the poly-crystal silicon thin film transistor fabricated in accordance with the related art method. In addition, the following description will be made by example of the fabrication method for the N-channel type thin film transistor; however, this embodiment can be similarly applied to the P-channel type thin film transistor only by changing the kind of an impurity as a dopant. Here, the fabrication method for the thin film transistor with a bottom gate structure will be described. Referring to FIG. 5A, a metal film made from Al, Ta, Mo, W, Cr, Cu, or an alloy of either of the metals is formed on an insulating substrate 0 made from glass to a thickness of 100 to 300 nm; and is patterned into a gate electrode 1.

Figure 5B:
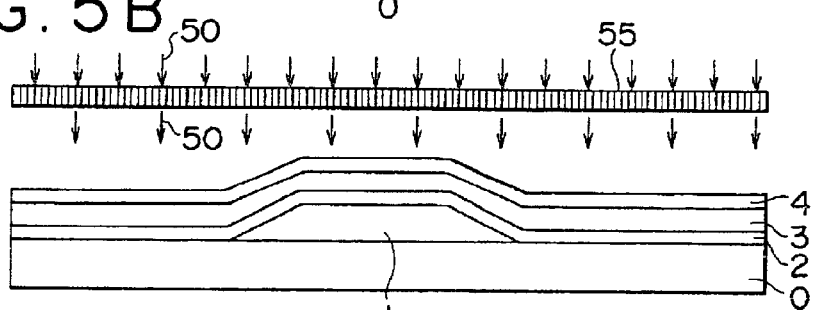

Referring to FIG. 5B, a gate insulating film is formed on the gate electrode 1. In this embodiment, the gate insulating film has a double-layer structure of a gate nitride film 2 (SiN$_x$)/gate oxide film 3 (SiO$_2$). The gate nitride film 2 is formed by a plasma CVD (PCVD) process using a mixture of SiH$_4$ gas and NH$_3$ gas as a source gas. In addition, the plasma CVD process may be replaced with a normal pressure CVD or a low pressure CVD process. The gate nitride film 2 is formed to a thickness of 50 nm. The gate oxide film 3 is formed to a thickness of about 200 nm on the gate nitride film 2. Then, a semiconductor thin film 4 made from amorphous silicon is continuously formed to a thickness of about 30 nm to 80 nm on the gate oxide film 3. The gate insulating film having the double-layer structure and the amorphous semiconductor thin film 4 are continuously formed in the same film formation chamber without changing the vacuum condition. If the above film formation is performed by the plasma CVD process, the resultant structure is subjected to a so-called dehydrogenation annealing for releasing hydrogen contained in the amorphous semiconductor thin film 4. The dehydrogenation annealing is performed in a nitrogen atmosphere at a temperature of 400 to 450° C. for one hour.

Next, the amorphous semiconductor thin film 4 is crystallized by irradiating the amorphous semiconductor thin film 4 with the laser beam 50 in accordance with the crystallization process of the present invention. An excimer laser beam is used as the laser beam 50. The surface of the substrate 0 is divided into a plurality of division regions, and the laser beam 50 is shaped to adjust an irradiation region of the laser beam 50 such that one division region is collectively irradiated with one shot of the laser beam 50. The initial division region is irradiated with the laser beam 50 under such a condition. At this time, the intensity of the laser beam 50 is optically modulated by the micro-slit 55 such that a cyclic light-and-dark pattern is protected on the irradiation region. Then, the pattern is shifted such that the light and dark portions of the pattern after shifting are not overlapped to those of the pattern before shifting, and the same division region is irradiated with the laser beam 50. In this way, the initial division region on the semiconductor thin film 4 is crystallized. The irradiation region of the laser beam 50 is shifted from the initial division region to the next division region, and the crystallization step is repeated for the new division region.

Figure 5C:
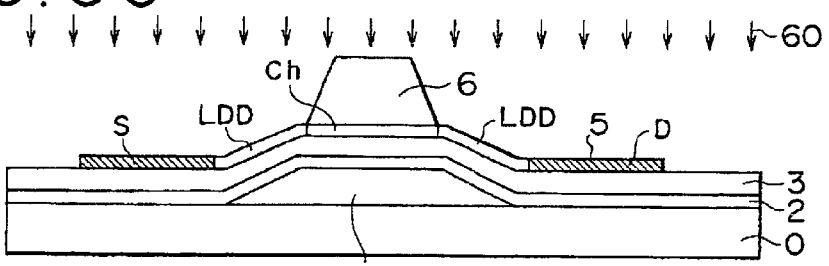

Next, as shown in FIG. 5C, to control the threshold voltage Vth of the thin film transistor, ion implantation is performed for a poly-crystal semiconductor thin film 5 crystallized at the previous step, as needed. In this embodiment, ions of B$^+$ are implanted in the poly-crystal semiconductor thin film 5 at 10 keV in a dose of about $5\times10^{11}$/cm$^2$ to $4\times10^{12}$/cm$^2$. A stopper film 6 made from SiO$_2$ is formed on the poly-crystal semiconductor thin film 5 to a thickness of about 100 nm to 300 nm by the plasma CVD process. In this embodiment, silane gas SH$_4$ and oxygen gas are decomposed by plasma, to deposit SiO$_2$. The stopper film 6 made from SiO$_2$ is patterned into a specific shape in such a manner as to be aligned to the gate electrode 1 by using a back side exposure technique. A portion of the poly-crystal semiconductor thin film 5, positioned directly under the stopper film 6, is protected as a channel region Ch. As described above, the channel region Ch is previously doped with a relatively low dose of B$^+$ ions by ion implantation performed for controlling the threshold voltage Vth of the thin film transistor. Ions of an impurity (for example, P$^+$) are implanted in the semiconductor thin film 5 using the stopper film 6 as a mask, to form LDD regions on both sides of the channel region Ch. At this time, the dose is set in a range of $5\times10^{12}$/cm$^2$ to $1\times10^{13}$/cm$^2$, and the acceleration voltage is set at 10 KeV. A photoresist having a pattern to cover the stopper film 6 and the LDD regions on both the sides thereof is formed, and ions of an impurity (for example, P$^+$) are heavily doped using the photoresist as a mask by an ion shower doping process, to form a source region S and a drain region D. In this ion shower doping process in which the impurity is doped by field acceleration with no mass separation, the impurity is doped at an acceleration voltage of 10 KeV in a dose of about $1\times10^{15}$/cm$^2$. While not shown, in the case of forming the P-channel type thin film transistor, a region of the N-channel type thin film transistor is covered with a photoresist, and the impurity changed from P$^+$ ions to B$^+$ ions may be doped in a dose of about $1\times10^{15}$/cm$^2$. It should be noted that the impurity may be doped by using a mass separation type ion implantation apparatus. After that, the impurity doped in the poly-crystal semiconductor thin film 5 is activated by RTA (rapid thermal annealing) 60. The RTA may be often replaced with ELA (excimer laser annealing). Then, the semiconductor thin film 5 and the stopper 6 are simultaneously patterned to separate thin film transistors for each of the isolation regions.

Figure 5D:
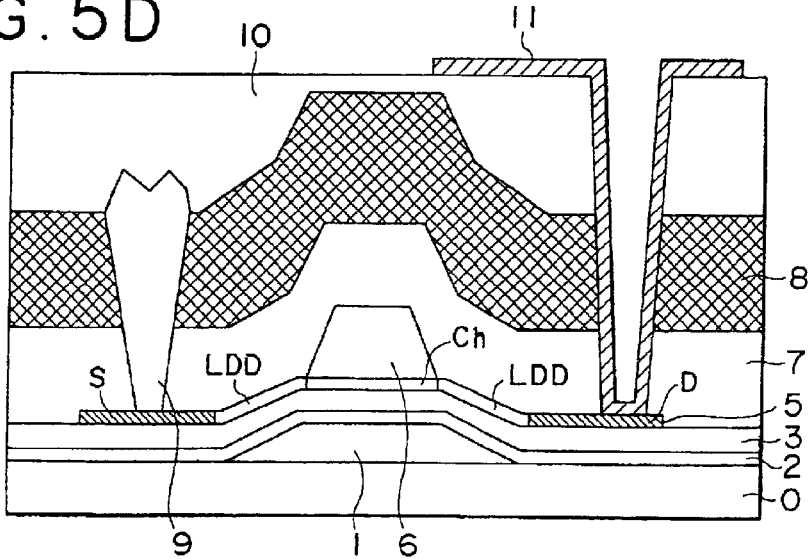

Finally, as shown in FIG. 5D, an interlayer insulating film 7 made from SiO$_2$ is formed over the entire surface to a thickness of about 100 to 200 nm. A passivation film (cap film) 8 made from SiN$_x$ is formed on the interlayer insulating film 7 to a thickness of about 200 to 400 nm by the plasma CVD process. The resultant structure is then heated in a nitrogen gas or forming gas atmosphere, or in a vacuum atmosphere at a temperature of 350° C. to 450° C. for one hour, to diffuse hydrogen atoms contained in the interlayer insulating film 7 in the semiconductor thin film 5. After that, a contact hole reaching the semiconductor thin film 5 is formed, and a metal film made from Mo or Al is formed to a thickness of. 100 to 200 nm by sputtering in such a manner as to fill the hole and is patterned into a specific shape to form an interconnection electrode 9. A planarization layer 10 made from an acrylic resin is then applied to a thickness of about 1 μm and a contact hole reaching the semiconductor thin film 5 is formed. Then, a transparent conductive film made from ITO or IXO is formed on the planarization layer 10 by sputtering and is patterned into a specific shape to form a pixel electrode 11. After that, in the case of the organic EL display, an organic EL material may be deposited by sputtering or the like.

Figure 6A:
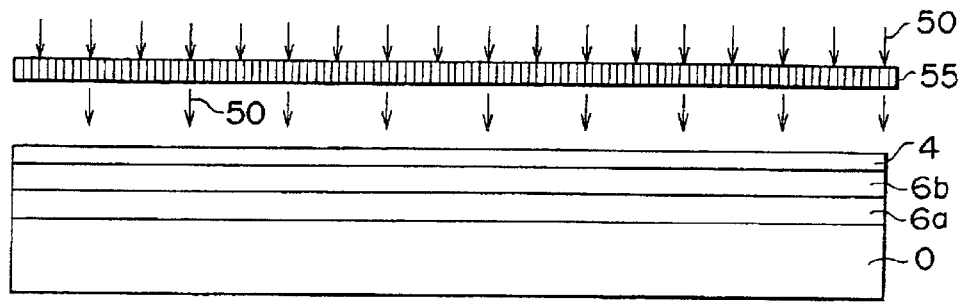
FIGS. 6A to 6C are views showing sequential fabrication steps for illustrating a second embodiment of the method of fabricating a thin film transistor according to the present invention.
Figure 6B:
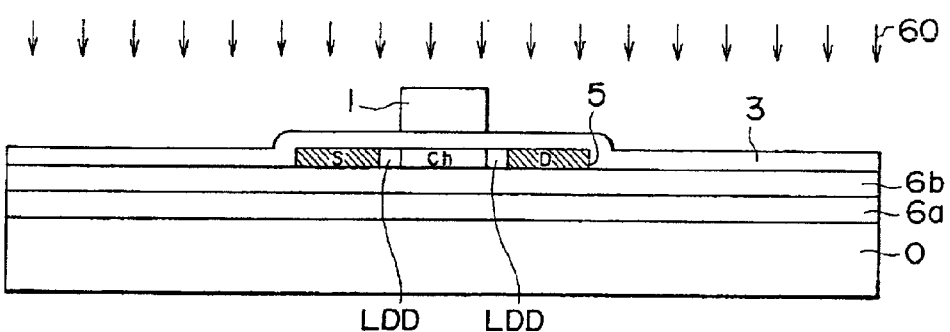
Figure 6C:
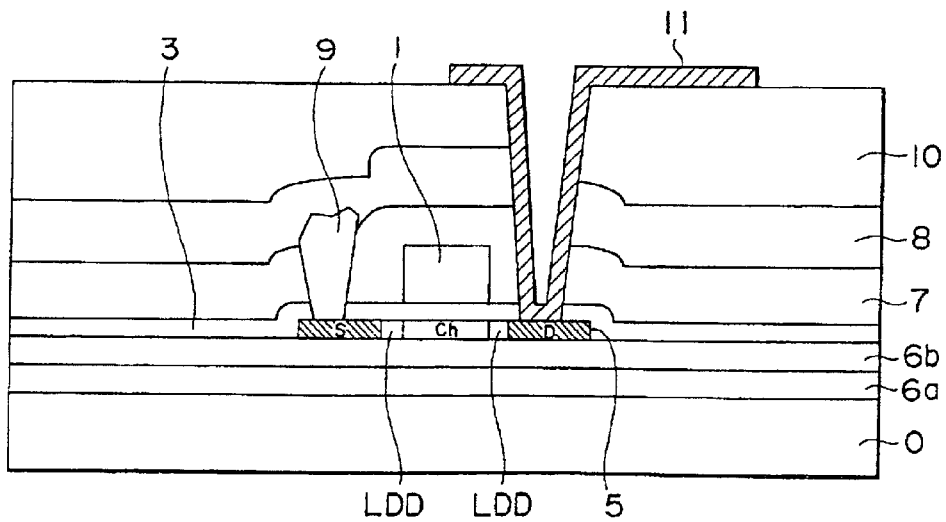

FIGS. 6A to 6C are sequential fabrication steps illustrating a second embodiment of the method of fabricating a thin film transistor used for typically an LCD according to the present invention. The mobility of a poly-crystal silicon thin film transistor fabricated in accordance with this embodiment is in a range of 320 to 430 cm$^2$/VS for the N-channel type and is in a range of 160 to 220 cm$^2$/Vs for the P-channel type, which is significantly higher than that of the poly-crystal silicon thin film transistor fabricated in accordance with the related art method. In addition, this embodiment is different from the first embodiment in that a thin film transistor having a top gate structure is fabricated in this embodiment. First, as shown in FIG. 6A, double under-films 6a and 6b forming a buffer layer are continuously formed on the insulating substrate 0 by the plasma CVD process. The under-film 6a at the first layer, made form SiN$_x$, is also formed to a thickness of 100 nm to 200 nm, and the under-film 6b at the second layer, made from SiO$_2$, is formed to a thickness of 100 nm to 200 nm. A semiconductor thin film 4 made from amorphous silicon is formed to a thickness of about 30 nm to 80 nm on the under-film 6b made from SiO$_2$ by the plasma CVD process or LPCVD process. If the semiconductor thin film 4 made from amorphous silicon is formed by the plasma CVD process, the resultant structure is annealed in a nitrogen atmosphere at a temperature ranging from 400° C. to 450° C. for about one hour for elimination of hydrogen in the film. If needed, the above-described ion implantation for controlling the threshold voltage Vth may be performed. In this case, ions of B$^+$ are implanted in the semiconductor thin film 5 at an acceleration voltage of about 10 KeV in a dose of about $5\times10^{11}$/cm$^2$ to $4\times10^{12}$/cm$^2$.

Next, the amorphous semiconductor thin film 4 is crystallized in accordance with the crystallization process of the present invention. The surface of the substrate 0 is divided into a plurality of division regions, and the laser beam 50 is shaped to adjust an irradiation region of the laser beam 50 such that one division region is collectively irradiated with one shot of the laser beam 50. The initial division region is irradiated with the laser beam 50 under such a condition. At this time, the intensity of the laser beam 50 is optically modulated by the micro-slit 55 such that a cyclic light-and-dark pattern is projected on the irradiation region. Then, the pattern is shifted such that the light and dark portions of the pattern after shifting are not overlapped to those of the pattern before shifting, and the same division region is irradiated with the laser beam 50. In this way, the initial division region on the semiconductor thin film 4 is crystallized. The irradiation region of the laser beam 50 is shifted from the initial division region to the next division region, and the crystallization step is repeated for the division region.

Referring to FIG. 6B, a semiconductor thin film 5 converted into poly-crystal silicon is patterned into an island shape. A gate insulating film 3 made from SiO$_2$ is formed to a thickness of 10 nm to 400 nm, preferably, 100 nm on the semiconductor thin film 5 by the plasma CVD process, normal CVD process, Low CVD process, ECR-CVD process, or sputtering process. A metal film made from Al, Ti, Mo, W, Ta, doped poly-crystal silicon, or an alloy of either of the metals is formed to a thickness of 200 nm to 800 nm on the gate insulating film 3, and is patterned into a specific shape to form a gate electrode 1. Ions of P$^+$ are implanted in the semiconductor thin film 5 over the entire surface using the gate electrode 1 as a mask by the ion implantation process using mass separation, to form LDD regions. The dose is set in a range of $6\times10^{12}$/cm$^2$ to $5\times10^{13}$/cm$^2$, and the acceleration voltage is set at 90 KeV. A channel region Ch positioned directly under the gate electrode 1 is protected, and is left as doped with ions of B$^+$ by ion implantation for controlling the threshold voltage Vth. After formation of the LDD regions by ion implantation, a resist pattern is formed in such a manner as to cover the gate electrode 1 and its neighborhood, and ions of P$^+$ are heavily doped by the ion shower doping process of the no mass separation type using the resist pattern as a mask, to form a source region S and a drain region D. In this ion shower doping process, the dose is set at about $1\times10^{15}$/cm$^2$ and the acceleration voltage is set at 90 KeV, and hydrogen diluted 20% PH$_3$ gas is used as a doping gas. In the case of forming a CMOS circuit, after a resist pattern for a P-channel thin film transistor is formed, ions of B$^+$ may be implanted at an acceleration voltage of 90 KeV in a dose ranging from about $1\times10^{15}$/cm$^2$ to $3\times10^{15}$/cm$^2$ by using a doping gas composed of 5%–20% B$_2$H$_6$/H$_2$ gas mixture. It should be noted that the source region S and the drain region D may be formed by using the ion implantation apparatus of the mass-separation type. After, the dopant implanted in the semiconductor thin film 5 is activated by, for example, the same RTA 60 using an infrared lamp as that used in the first embodiment.

Finally, as shown in FIG. 6C, an interlayer insulating film 7 made from PSG is formed in such a manner as to cover the gate electrode 1. A passivation film (cap film) 8 made from SiN$_x$ is formed to a thickness of about 200 nm to 400 nm on the interlayer insulating film 7 by the plasma CVD process. The resultant structure is then heated in a nitrogen gas atmosphere at 350° C. for about one hour, to diffuse hydrogen atoms contained in the interlayer insulating film 7 in the semiconductor thin film 5. After that, a contact hole reaching the semiconductor thin film 5 is formed, and a metal film made from Al—Si is formed on the passivation film 8 by sputtering in such a manner as to fill the hole and is patterned into a specific shape to form an interconnection electrode 9. A planarization layer 10 made from an acrylic resin is then applied to a thickness of about 1 μm and a contact hole reaching the semiconductor thin film 5 is formed. Then, a transparent conductive film made from ITO or IXO is formed on the planarization layer 10 by sputtering and is patterned into a specific shape to form a pixel electrode 11. After that, in the case of the organic EL display, an organic EL material may be deposited by sputtering or the like.

In the second embodiment shown in FIGS. 6A to 6C, the amorphous semiconductor thin film is crystallized in the same manner as that described in the first embodiment shown in FIGS. 5A to 5D. This embodiment in which the thin film transistor having the top gate structure is fabricated, however, is different from the first embodiment in which the thin film transistor having the bottom gate structure is fabricated in that the amorphous semiconductor thin film is crystallized before the pattern of the gate electrode is formed. As a result, according to this embodiment, since the allowance of the contraction of the insulating substrate made from glass is larger than that in the first embodiment, the crystallization can be performed by using a larger output laser irradiation system.

Figure 7:
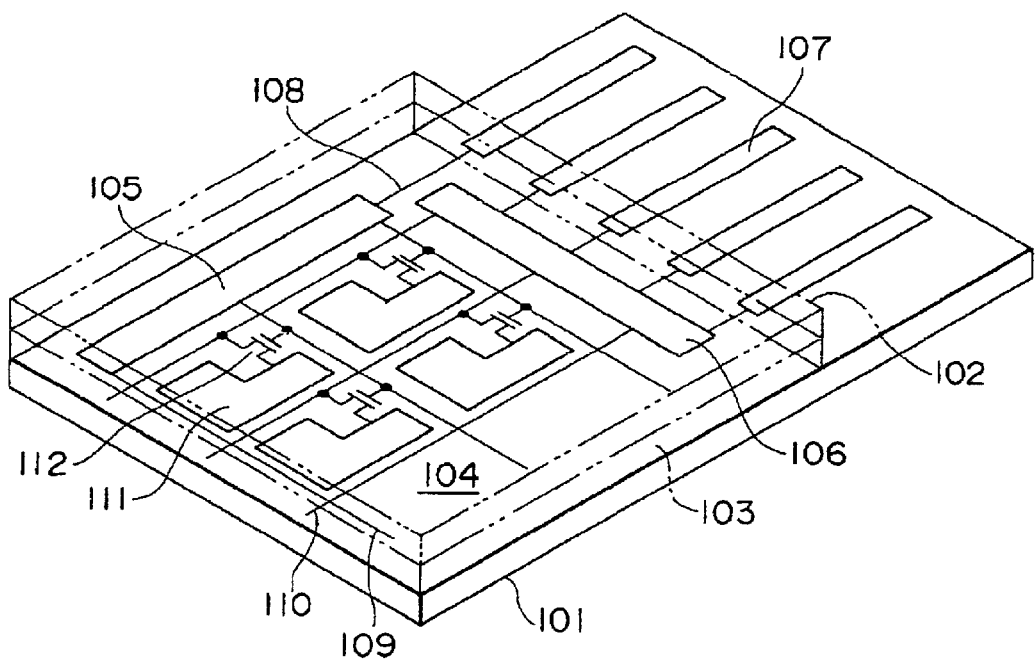
FIG. 7 is a schematic perspective view showing one example of a display in which thin film transistors fabricated in accordance with the present invention are packed.

FIG. 7 shows one example of an active matrix type display using thin film transistors fabricated in accordance with the first or second embodiment. Referring to FIG. 7, the display has a panel structure including a pair of insulating substrates 101 and 102, and an electrooptic material 103 held therebetween. A liquid crystal material is widely used as the electrooptic material 103. A pixel array portion 104 and a drive circuit portion are integratedly formed on the lower insulating substrate 101. The drive circuit portion made from a thin film transistor is divided into a vertical drive circuit 105 and a horizontal drive circuit 106. Terminals 107 to be connected to external terminals are formed at the upper end of a peripheral portion of the insulating substrate 101. The terminals 107 are connected to the vertical drive circuit 105 and the horizontal drive circuit 106 via interconnections 108. Gate interconnections 109 made from Mo in rows and signal interconnections 110 made from Al in columns are formed on the pixel array portion 104. Pixel electrodes 111 made from ITO and thin film transistors 112 for driving the pixel electrodes 111 are formed at intersections between the gate interconnections 109 and the signal interconnections 110. For each of the thin film transistors 112, a gate electrode is connected to the corresponding gate interconnection 109; a drain region is connected to the corresponding pixel electrode 111; and a source region is connected to the corresponding signal interconnection 110. Each gate interconnection 109 is connected to the vertical drive circuit 105 and each signal interconnection 110 is connected to the horizontal drive circuit 106. The thin film transistors 112 for switchingly driving the pixel electrodes 111 and thin film transistors contained in the vertical drive circuit 105 and the horizontal drive circuit 106 are fabricated in accordance with the present invention. Such a thin film transistor has a mobility higher than that fabricated in accordance with the related art method. As a result, not only the drive circuits but also processing circuits each having a higher performance can be integratedly formed.

Figure 8:
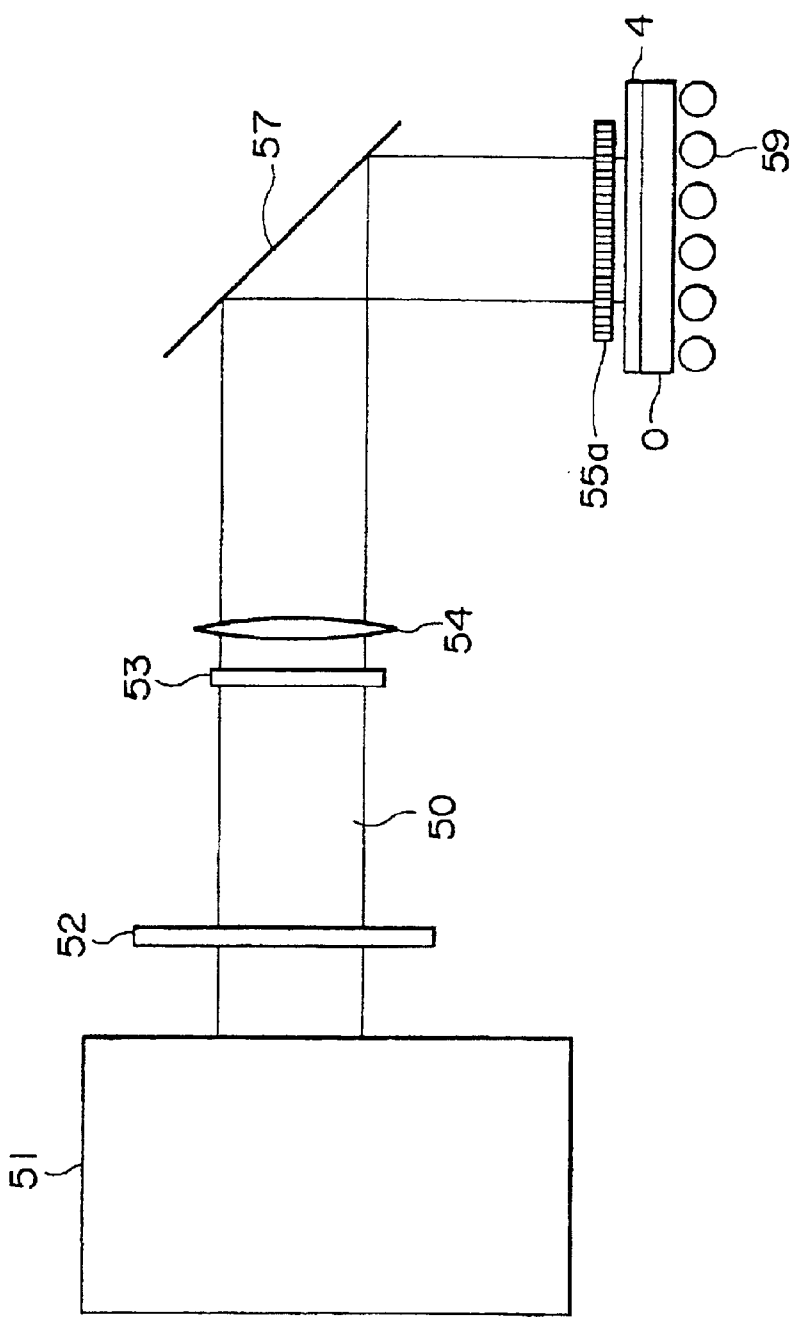
FIG. 8 is a schematic block diagram showing another example of the laser irradiation system of the present invention.

Next, another embodiment of the laser irradiation system of the present invention will be described with reference to FIG. 8. In FIG. 8, reference numeral 51 designates a large output excimer laser light source; 52 is a slit for shaping a laser beam into a rectangular shape; 53 is a beam homogenizer; 54 is a condenser lens; 55a is a phase shift mask; and 57 is a mirror. A semiconductor thin film 4 is previously formed on a substrate 0 to be processed. The phase shift mask 55a is disposed on the surface side of the substrate 0 in such a manner as to be close to the substrate 0. A heating lamp 59 is disposed on the back side of the substrate 0 in such a manner as to be close to the substrate 0. A laser beam 50 is emitted from the laser light source 51 to the substrate 0 via the phase shift mask 55a, to crystallize the semiconductor thin film 4. The concrete crystallization process will be described with reference to FIGS. 9A and 9B.

Figure 10:
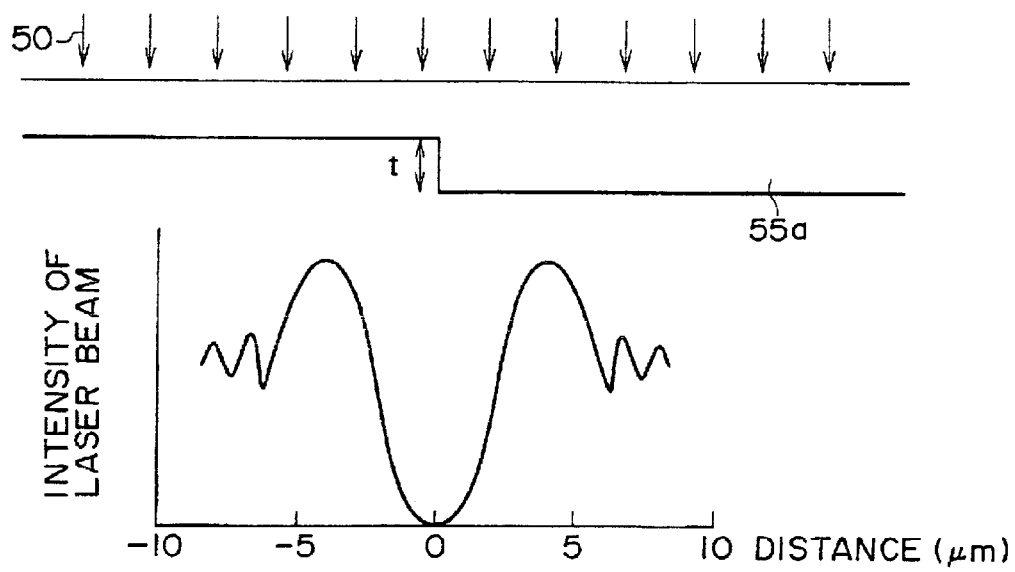
FIG. 10 is a diagram illustrating a phase shift mask assembled in the laser irradiation system of the present invention.

Prior to description of the crystallization process with reference to FIG. 9, the principle of the phase shift mask will be described. As shown in FIG. 10, the phase shift mask is configured as a quartz having a stepped portion. The diffraction and interference of the laser beam 50 occur at the boundary of the stepped portion of the quartz, whereby a cyclic spatial distribution is given to the intensity of the laser beam 50. In the example shown in FIG. 10, a phase difference of 180° is given on the right and left sides with respect to the stepped portion x=0 taken as the boundary. In general, to give the phase difference of 180° by forming a transparent medium having a refractive index "n" on a transparent base member, the thickness "t" of the transparent medium is given by an equation of $t=\lambda/2(n-1)$ where $\lambda$ is the wavelength of the laser beam. Letting the refractive index of the quartz base member be 1.46, since the wavelength of the XeCl excimer laser beam is 308 nm, the stepped portion of 334.8 nm may be formed by etching to give the phase difference of 180°. In the case of forming an $SiN_x$ film as the transparent medium by PECVD or LPCVD, letting the refractive index of the $SiN_x$ film be 2.0, the $SiN_x$ film may be formed on the quartz base member to a thickness of 154 nm, followed by etching to form the stepped portion of 154 nm. The intensity of the laser beam 50 having passed through the phase shift mask 55a having the phase difference of 180° exhibits a cyclic strong-and-weak pattern shown in FIG. 10.

Figure 11:
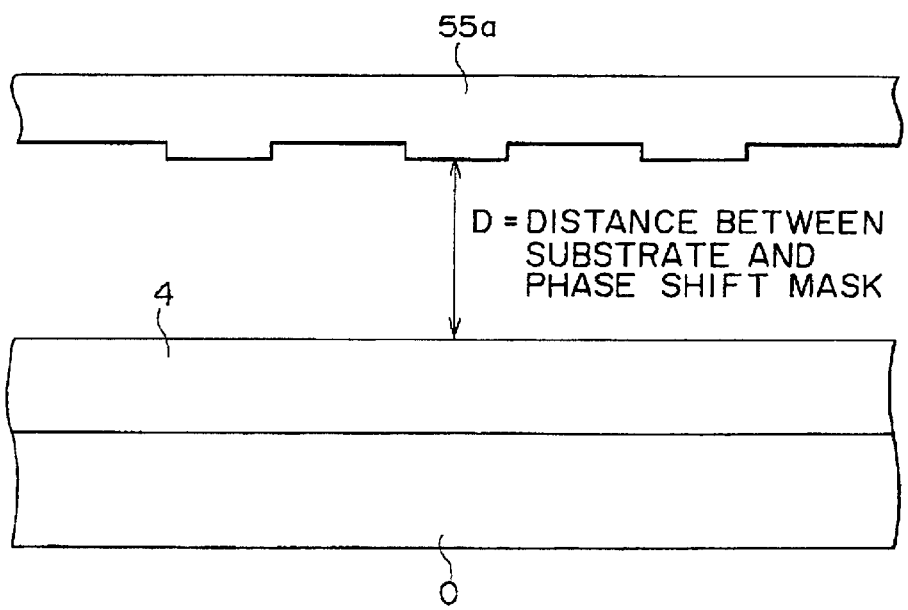
FIG. 11 is a diagram illustrating the operational state of the phase shift mask.

The cyclic phase shift mask 55a is formed by cyclically repeating the above stepped portions as shown in FIG. 11. For the phase shift mask 55a shown in FIG. 11, the width of the phase shift stripe and the distance between the stripes are each set at 3 μm. Letting a distance between the semiconductor thin film 4 made from silicon and the phase shift mask 55a be "d", as the "d" becomes larger, the degree of the diffraction becomes larger and thereby the modulation cycle of the intensity of the laser beam becomes longer. The value of "d" is preferably set in a range of 0.05 to 3.0 mm. The phase difference is not necessarily set at 180° but may be set at a value capable of realizing the strong-and-weak pattern of the laser beam. When the XeCl excimer laser beam having a wavelength of 308 nm is used, the pulse continuation time of one shot of the laser beam is in a range of 20 to 200 ns. When the phase shift mask 55a having the above configuration is inserted between the laser light source and the semiconductor thin film 4 made from amorphous silicon and the semiconductor thin film 4 is irradiated with the pulse laser beam, the laser beam passing through the cyclic phase shift mask 55a causes the diffraction and interference, whereby a cyclic strong-and-weak pattern of the intensity of the laser beam occurs. The semiconductor thin film 4 is perfectly melted at the portions strongly irradiated with the laser beam, and a temperature gradient occurs between the portions weakly irradiated with the laser beam 4 and the same. In such a state, the lateral crystal growth proceeds from solid silicon to the perfectly melted silicon by a distance of about 0.3 to 3.5 μm on one side by one shot of the laser irradiation. The phase shift mask 55a is moved by a distance shorter than the lateral crystal growth distance, and the same irradiation region is irradiated again with one shot of the laser beam. By repeating such a laser irradiation step, the crystal continuously grows in the lateral direction in the irradiation region.

FIGS. 9A and 9B are schematic diagrams each showing the state of crystal growth. Referring to FIG. 9A, silicon at only the light portions strongly irradiated with the laser beam is melted, and the lateral crystal growth proceeds from solid silicon at the dark portions weakly irradiated with the laser beam to the melted silicon. Referring to FIG. 9B, the phase shift mask 55a having the stepped portions cyclically arranged is shifted in the crystal growth direction by a distance $\Delta S$ equal to or shorter than the lateral crystal growth distance, and the same irradiation region is irradiated again with one shot of the laser beam. By repeating such a laser irradiation step, silicon on the entire surface of the rectangular irradiation region of the laser beam is crystallized. According to the crystallization process of the present invention, there can be obtained a crystalline silicon thin film having a very high quality with no crystal grain boundary in the crystal growth direction.

FIG. 1, which has been already described, is the view three-dimensionally showing the steps shown in FIGS. 9A and 9B. Referring to FIG. 1, by shifting the pattern in the direction (a) by each distance of about 1 μm to crystallize the initial division region D, shifting the irradiation region of the laser beam 50 in the direction (b), and repeating the above step, the entire surface of the semiconductor thin film 4 on the substrate 50 can be crystallized. In this case, the rectangular beam has a size of 61 mm×73 mm, and the whole of the cross-section of the rectangular laser beam 50 is covered with the above-described cyclic phase shift mask. In the case of using such a cyclic phase mask, a crystallization distance "r" by one shot of laser irradiation is given by multiplying "the lateral growth distance by one shot" by "the number of stripes of the phase shift pattern". In this embodiment, one cycle of the stripes of the phase shift pattern is 6 μm, and therefore, 10,166 stripes are contained in the rectangular beam. Since crystal growth proceeds by about 1 μm for each laser irradiation, if the pattern is shifted in the minor axis direction, the entire surface of one division region D is crystallized by six shots of laser irradiation. The calculation of the throughput for crystallizing the entire semiconductor thin film on the substrate 0 will be described below. In the case where the rectangular beam has a size of 61 mm×73 mm and the glass substrate 0 has a size of 600 mm×720 mm, letting the overlapped width of the rectangular beams adjacent to each other in the direction (b) be 1 mm, the total shot number required for crystallization of the entire semiconductor thin film on the substrate becomes about 600 shots when the frequency of laser oscillation is set at 10 Hz. Accordingly, the tack time for crystallization required for each substrate becomes about 60 seconds, which is sufficiently fast as the throughput for mass-production. In addition, the pattern of the cyclic phase shift mask is not limited to the straight line slit pattern but may be, as shown in FIGS. 2A to 2D, a corrugated slit pattern, a chevron pattern, or a grid pattern. As described above, according to this embodiment, crystallization is performed by using the phase shift mask causing diffraction of the laser beam to form a cyclic light-and-dark pattern. Since the phase shift mask in this embodiment makes use of diffraction of the laser beam, the loss of the laser beam becomes smaller than that in the case of using the micro-slit, to thereby improve the usability of the energy. Further, since this embodiment is configured only by inserting the phase shift mask in the optical path, the configuration of the optical system is relatively simple.

As described above, according to the present invention, it is possible to obtain a high quality silicon thin film having a crystallinity similar to that of a single crystal, which cannot be obtained by simple multiple shots of the laser beam. The mobility of the poly-crystal thin film transistor obtained according to the present invention is, in the first embodiment, in a range of 270 to 350 $cm^2/Vs$ for the NMOS and in a range of 160 to 250 $cm^2/Vs$ for the PMOS; and is, in the second embodiment, in a range of 320 to 430 $cm^2/Vs$ for the NMOS and in a range of 160 to 220 $cm^2/Vs$. By applying the poly-crystal silicon thin film transistor of the present invention to a display device such as a liquid crystal display or EL, highly functional operating devices can be formed in a peripheral circuit. This is effective for realization of the system-on-panel. In particular, according to the embodiment of using the phase shift mask which makes use of diffraction of the laser beam, the loss of the laser beam becomes smaller than that in the case of using the micro-slit, to thereby improve the usability of the energy, and further, since this embodiment is configured only by inserting the phase shift mask in the optical path, the configuration of the optical system is relatively simple.

While the preferred embodiments of the present invention have been described using specific terms, such description is for illustrative purposes only, and it is to be understood that changes and variations may be made without departing from the spirit or scope of the following claims.

What is claimed is:

1. A process of crystallizing a semiconductor thin film previously formed on a substrate by irradiating the semiconductor thin film with a laser beam, comprising:

a preparation step of dividing the surface of the substrate into a plurality of division regions, and shaping a laser beam to adjust an irradiation region of the laser beam such that one of the division regions is collectively irradiated with one shot of the laser beam;

a crystallization step of irradiating one of the division regions with the laser beam while optically modulating the intensity of the laser beam such that a cyclic light-and-dark pattern is projected on the irradiation region, and irradiating the same division region by at least one time after shifting the pattern such that the light and dark portions of the pattern after shifting are not overlapped to those of the pattern before shifting; and a scanning step of shifting the irradiation region of the laser beam to the next division region, and repeating said crystallization step for the division region.

2. A process of crystallizing a semiconductor thin film according to claim 1, wherein said crystallization step comprises a step of controlling the direction of crystallization by making use of a temperature gradient corresponding to the light-and-dark pattern, and irradiating the same division region again after shifting the pattern by a distance within a crystallization distance by one shot of laser irradiation.

3. A process of crystallizing a semiconductor thin film according to claim 1, wherein said crystallization step is carried out in a state in which the substrate is heated at a temperature of 200° C. or more.

4. A process of crystallizing a semiconductor thin film according to claim 1, wherein said crystallization step is performed by using a phase shift mask which diffracts the laser beam to form a cyclic light-and-dark pattern.

* * * * *